(12) United States Patent
Zhang et al.

(10) Patent No.: US 10,679,554 B2
(45) Date of Patent: Jun. 9, 2020

(54) PIXEL CIRCUIT WITH COMPENSATION FOR DRIFT OF THRESHOLD VOLTAGE OF OLED, DRIVING METHOD THEREOF, AND DISPLAY DEVICE

(71) Applicant: Peking University Shenzhen Graduate School, Guangdong (CN)

(72) Inventors: Shengdong Zhang, Guangdong (CN); Xue Meng, Guangdong (CN); Chuanli Leng, Guangdong (CN)

(73) Assignee: Peking University Shenzhen Graduate School, Guangdong (CN)

( * ) Notice: Subject to any disclaimer, the term of this patent is extended or adjusted under 35 U.S.C. 154(b) by 36 days.

(21) Appl. No.: 15/569,027

(22) PCT Filed: Mar. 25, 2016

(86) PCT No.: PCT/CN2016/077393
§ 371 (c)(1),
(2) Date: Oct. 24, 2017

(87) PCT Pub. No.: WO2016/169388
PCT Pub. Date: Oct. 27, 2016

(65) Prior Publication Data
US 2018/0130412 A1    May 10, 2018

(30) Foreign Application Priority Data
Apr. 24, 2015   (CN) .......................... 2015 1 0201349

(51) Int. Cl.
*G09G 3/3233*     (2016.01)
*G09G 3/3258*     (2016.01)
(Continued)

(52) U.S. Cl.
CPC ............. *G09G 3/3233* (2013.01); *G09G 3/32* (2013.01); *G09G 3/3258* (2013.01);
(Continued)

(58) Field of Classification Search
CPC ...... G09G 3/32; G09G 3/3233; G09G 3/3258; G09G 2310/0264; G09G 2300/0861; G09G 2310/0262; H01L 51/5203
See application file for complete search history.

(56) References Cited

U.S. PATENT DOCUMENTS 9,361,827 B2 *  6/2016  Qian ..................... G09G 3/325
2013/0249413 A1 *  9/2013  Chen .................... G09G 3/3258
                                                                    315/172
(Continued)

FOREIGN PATENT DOCUMENTS

| CN | 201518210 U | 6/2010 |
| CN | 103440840 A | 12/2013 |
| CN | 104821150 A | 8/2015 |
| JP | 2008309910 A | 12/2008 |

OTHER PUBLICATIONS

PCT Search Report and Written Opinion dated Oct. 27, 2016, International Application No. PCT/CN2016/077393, filed Mar. 25, 2016, 31 pages.
(Continued)

*Primary Examiner* — Kwang-Su Yang
(74) *Attorney, Agent, or Firm* — Lee & Hayes, P.C.

(57) ABSTRACT

Provided is a pixel circuit. The pixel circuit comprises a driving transistor and a light-emitting element both coupled in series between a first level end and a second level end, and comprises a second transistor, a third transistor, a fourth transistor, a first capacitor and a second capacitor. The second capacitor is coupled between a control electrode of the driving transistor and a second end of the light-emitting element. A threshold voltage is stored by the first capacitor, so that threshold voltage compensation for the driving transistor and the light-emitting element is implemented, and therefore the non-uniformity of the display of the pixel circuit is compensated. Also provided is a display device,
(Continued)

wherein a first control line and a light-emitting control line are both global lines. Also disclosed is a pixel circuit driving method.

9 Claims, 7 Drawing Sheets

(51) Int. Cl.
*H01L 51/52* (2006.01)
*G09G 3/32* (2016.01)

(52) U.S. Cl.
CPC . *H01L 51/5203* (2013.01); *G09G 2300/0861* (2013.01); *G09G 2310/0262* (2013.01); *G09G 2310/0264* (2013.01)

(56) References Cited

U.S. PATENT DOCUMENTS

2013/0335391 A1* 12/2013 Kim ............... G09G 3/3291
                                                345/211
2015/0310806 A1* 10/2015 Hu ................ G09G 3/3258
                                                345/78

OTHER PUBLICATIONS

CN Office Action dated Dec. 8, 2016, CN Application No. 201510201349.6, 9 pages.
CN Office Action dated Aug. 10, 2017, CN Application No. 201510201349.6, 4 pages.

* cited by examiner

PIXEL CIRCUIT WITH COMPENSATION FOR DRIFT OF THRESHOLD VOLTAGE OF OLED, DRIVING METHOD THEREOF, AND DISPLAY DEVICE

CROSS REFERENCE TO RELATED APPLICATIONS

This application is a 35 USC § 371 filing of International Application No. PCT/CN2016/077393, filed Mar. 25, 2016, entitled PIXEL CIRCUIT, DRIVING METHOD THEREFOR, AND DISPLAY DEVICE, which claims the benefit of China Patent Application No. CN201510201349.6, filed Apr. 24, 2015, entitled PIXEL CIRCUIT, DRIVING METHOD THEREFOR, AND DISPLAY DEVICE, which are incorporated herein by reference.

FIELD

The application relates to the technical field of display, and specifically to a pixel circuit, a driving method thereof and a display device.

BACKGROUND

Organic light-emitting diode (OLED) displaying is being widely researched by people in recent years due to its advantages of high brightness, high light-emitting efficiency, wide angle of view, low power consumption, etc., and is rapidly applied to the new generation of display. The driving modes of OLED displaying can be divided into two modes, passive matrix OLED (PMOLED) and active matrix OLED (AMOLED). Though the cost of PMOLED is a low, high-resolution display can not be achieved due to crosstalk. Moreover, PMOLED has a large driving current, and therefore the service life of OLED is reduced. In contrast, in AMOLED, numbers of transistors which serve as current sources are included at individual pixels, so that crosstalk is avoided. The required driving current is smaller and power consumption is lower so that the service life of OLED is prolonged and a high-resolution display can be realized.

A pixel circuit of traditional AMOLED has a simple structure of two thin film transistors (TFT). Though such a circuit is simple in structure, the shift of threshold voltages of driving transistor T1 and OLED or non-uniformity the threshold voltages of TFT devices at various positions of panel caused by the fact that the TFT devices are made of polycrystalline materials cannot be compensated. When there is shift of threshold voltages of transistor T1 or the threshold voltages are inconsistent at various positions of the panel, the driving current $I_{DS}$ may change, and different pixels on the panel may also have different amount of shift due to different biasing voltages, which may cause non-uniformity of panel display.

Currently, the driving modes of pixel circuit mainly include two modes, one is progressive scanning, and the other is simultaneous compensation and emission of light.

Figure 1:
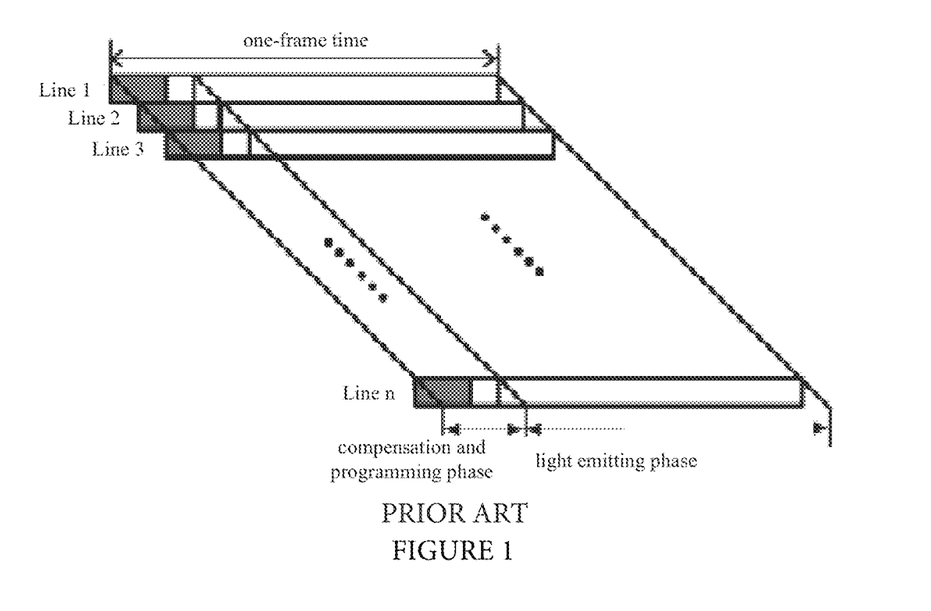
FIG. 1 is a view illustrating the principle of the driving mode of emitting light by scanning line by line in the prior art.

For progressive scanning mode, in one frame, the pixel circuits of each line are driven in sequence respectively, as shown in FIG. 1; the driving process of each line comprises an initialization phase, a threshold compensation phase, a programming phase and a light emitting phase. After the pixels of each line have finished programming, the process immediately proceeds to the light emitting phase. Herein, the initialization phase and the threshold compensation phase are referred to as the compensation phase for short. On the whole, the time of one frame is partially used for compensation and partially used for emitting light, and the whole one frame time is used for light emitting. In this driving mode, for the pixels of each line, the time of compensation and programming is short and the time of light emitting is long, but the pixel circuit of each line requires an independent control line, and the gate driving circuit is relatively complicated.

Figure 2:
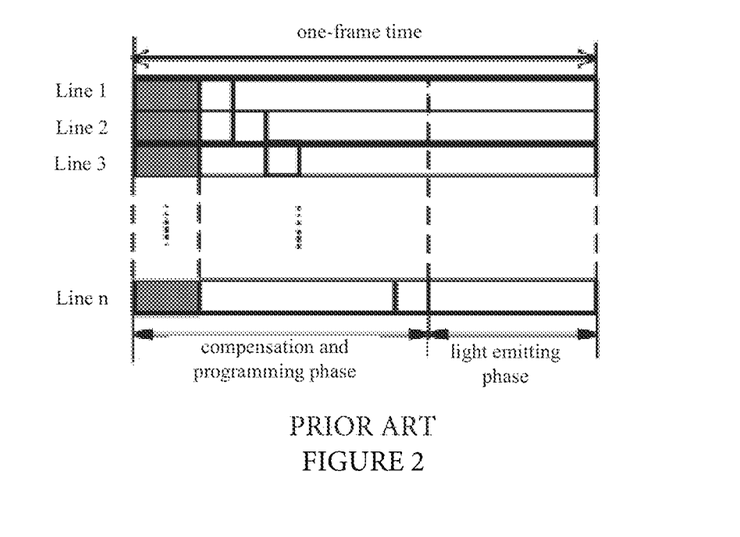
FIG. 2 is a view illustrating the principle of the driving mode of emitting light jointly by concentrated compensation in the prior art.

For the mode of simultaneous compensation and emission of light, in one frame, the driving process of each line comprises an initialization phase, a threshold compensation phase, a programming phase and a light emitting phase. Unlike the traditional progressive scanning, all the pixels are compensated altogether, and then the pixels of each line are programmed in sequence. After the pixels of all the lines have finished programming, they emit light simultaneously, as shown in FIG. 2. Herein, the initialization phase and the threshold compensation phase are referred to as the compensation phase for short. On the whole, the time of one frame is partially used for compensation and partially used for light emitting, and the time of light emitting is short. In this driving mode, the control lines of all the pixel circuits on the panel are shared in common (i.e., global control lines are used). However, since there is much idle waiting time for each line during the programming phase, the overall programming time is long and the time of light emitting is short.

SUMMARY

The application provides a pixel circuit, a driving method thereof and a display device so as to compensate drift of threshold voltages of driving transistor and light emitting elements and to realize a more uniform light emitting while simultaneously reducing the complexity of circuit.

According to a first aspect, an embodiment provides a pixel circuit, comprising:

a driving transistor and a light emitting element coupled in series between a first level end and a second level end, a second transistor, a third transistor, a fourth transistor, a first capacitor and a second capacitor; wherein a first electrode of the driving transistor is coupled to a second electrode of the third transistor to form a first node; a second electrode of the driving transistor is coupled to a first end of the light emitting element; a control electrode of the driving transistor is coupled to an end of the first capacitor to form a second node; another end of the first capacitor is coupled to a second electrode of the fourth transistor to form a third node; a control electrode of the third transistor is used for inputting a light emitting control signal; a first electrode of the third transistor and a second end of the light emitting element are used for being coupled to the first level end and the second level end respectively; a first electrode of the second transistor is coupled to the first node, a second electrode of the second transistor is coupled to the second node, and a control electrode of the second transistor is used for inputting a first control signal; a first electrode of the fourth transistor is used for being coupled to a data line, for inputting a data signal or also for inputting a reference level; a control electrode of the fourth transistor is used for inputting a scanning signal; the second capacitor is coupled between the control electrode of the driving transistor and the second end of the light emitting element.

According to a second aspect, an embodiment provides a display device, comprising:

a pixel circuit matrix which comprises the above described pixel circuits arranged in a matrix of n rows and m columns, wherein n and m are integers larger then zero; a gate driving circuit which is used for generating a scanning pulse signal and providing a required scanning signal to the pixel circuits through rows of scanning lines formed in a first direction; a data driving circuit which is used for generating a data voltage signal representing gray scale information and providing a data signal to the pixel circuits through individual data lines formed in a second direction; a first control line which is used for providing a first control signal to the individual pixel circuits in the pixel circuit matrix simultaneously; a light emitting control line which is used for providing a light emitting control signal to the individual pixel circuits in the pixel circuit matrix simultaneously; and a controller which is used for providing a control timing to the gate driving circuit, the data driving circuit, the first control line and the light emitting control line.

According to a third aspect, an embodiment provides a pixel circuit driving method, wherein each driving cycle comprises a dark data writing phase, an initialization and threshold compensation phase and a light emitting phase, the driving method comprising:

during the dark data writing phase, a fourth transistor is turned on in response to an effective level of a scanning signal and transmits a dark data voltage to a third node, and controls a light emitting element at a non-emitting state; during the initialization and threshold compensation phase, the third node receives a reference level so as to initialize the potential of the third node; a second node adjusts the potential according to threshold voltages of a driving transistor and the light emitting element, and stores this potential via a first capacitor; during the light emitting phase, the fourth transistor is turned on in response to an effective level of a scanning signal and transmits a light emitting data voltage to the third node, and is coupled to the second node via capacitor; the third transistor is turned on in response to an effective level of a light emitting control signal, and the driving transistor is turned on in response to the potential of the second node and drives the light emitting element to emit light.

According to the pixel circuit of the above described embodiment, the driving transistor uses a form of diode connection to adjust the potential of the control electrode of the driving transistor so that the threshold voltages of the driving transistor and the light emitting element can be read; the second capacitor is used to maintain the potential of the control electrode of the driving transistor and stores it in the first capacitor, thus enabling compensation of the threshold voltage of the driving transistor and further compensation of non-uniformity of pixel circuit displaying. The pixel circuit has a simple structure and requires less control lines.

According to the display device of the above described embodiment, both the first control line and the light emitting control line are global line, which reduces the complexity of driving the pixel circuit and which is also advantageous for reducing the cost.

DETAILED DESCRIPTION OF THE PREFERRED EMBODIMENTS

The application will be further described below in detail through specific embodiments with reference to the accompanying drawings.

Firstly, some terms are explained: the transistors in the application can be a transistor having any structure, e.g., a bipolar junction transistor (BJT) or a field-effect transistor (FET). When the transistor is a bipolar junction transistor, a control electrode thereof is a base of the bipolar junction transistor, a first electrode can be a collector or emitter of the bipolar junction transistor, and correspondingly a second electrode can be an emitter or collector of the bipolar junction transistor. In a practical application process, the "emitter" and the "collector" can be interchanged according to the flow direction of signal. When the transistor is a field-effect transistor, a control electrode thereof is a gate of the field-effect transistor, a first electrode can be a drain or source of the field-effect transistor, and correspondingly a second electrode can be a source or drain of the field-effect transistor. In a practical application process, the "source" and the "drain" can be interchanged according to the flow direction of signal. The transistors in a display are typically field-effect transistors: thin-film transistors (TFT). In the following, the application will be described in detail in an example in which the transistors are field-effect transistors, whereas in other embodiments, the transistors can also be bipolar junction transistors.

The light emitting element is organic light-emitting diode (OLED). In other embodiments, it can be also other light-emitting elements. A first end of the light-emitting element can be the cathode or the anode. Correspondingly, a second end of the light-emitting element is the anode or the cathode. It should be understood by those skilled in the art that the current should flow towards the cathode from the anode of the light-emitting element. Therefore, based on the flow direction of the current, the anode and the cathode of the light-emitting element can be determined.

An effective level can be a high level or a low level, and an adaptive exchange can be realized according to the functions of specific elements.

A first level end and a second level end are two ends of a power supply provided for the operation of the pixel circuit. In an embodiment, the first level end can be a high level end $V_{DD}$, and the second level end can be a low level end $V_{SS}$ or a ground line. In other embodiments, an adaptive exchange can be also made. It is noted that for a pixel circuit, the first level end (e.g., the high level end $V_{DD}$) and the second level end (e.g., the low level end VSS) are not a part of the pixel circuit of the application. In order that those skilled in the art can better understand the technical solutions of the application, the first level end and the second level end are especially introduced for description.

It is noted that for facilitating description and also for those skilled in the art to understand the technical solutions of the application more clearly, a first node A, a second node B and a third node C are introduced in the document of the application for identifying relevant parts of the circuit structure, and should not be considered as additional introduction of terminals.

For facilitating description, the high level is denoted by $V_H$, and the low level is denoted by $V_L$.

Embodiment I

Figure 3A:
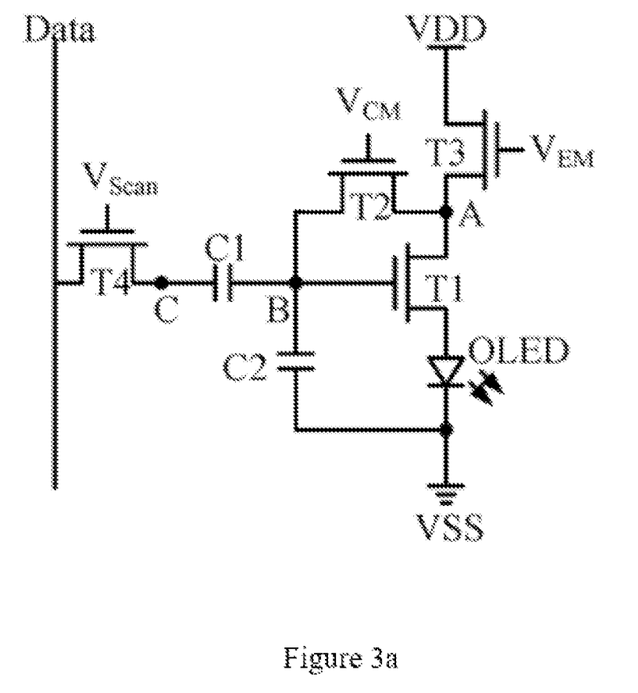
FIG. 3a is a structure diagram of a pixel circuit disclosed in the first embodiment.
Figure 3B:
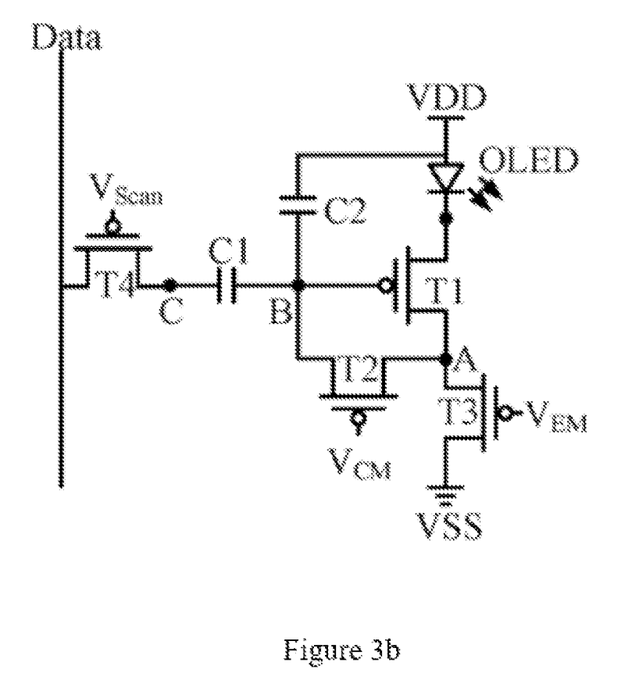
FIG. 3b is a structure diagram of another pixel circuit disclosed in the first embodiment.

Reference is made to FIGS. 3a and 3b, which show a structure diagram of a pixel circuit disclosed in the present embodiment, the pixel circuit comprising: a driving transistor T1 and a light emitting element OLED coupled in series between the first level end VDD and the second level end VSS, a second transistor T2, a third transistor T3, a fourth transistor T4, a first capacitor C1 and a second capacitor C2. In the pixel circuit shown in FIG. 3a, the individual transistors (the driving transistor T1, the second transistor T2, the third transistor T3 and the fourth transistor T4) are N-type thin film transistors; and in the pixel circuit shown in FIG. 3b, the individual transistors (the driving transistor T1, the second transistor T2, the third transistor T3 and the fourth transistor T4) are P-type thin film transistors.

A first electrode of the driving transistor T1 is coupled to a second electrode of the third transistor T3 to form a first node A; a second electrode of the driving transistor T1 is coupled to a first end of the light emitting element OLED; a control electrode of the driving transistor T1 is coupled to one end of the first capacitor C1 to form a second node B; and another end of the first capacitor C1 is coupled to a second electrode of the fourth transistor T4 to form a third node C.

A control electrode of the third transistor T3 is configured to receive a light emitting control signal $V_{EM}$; a first electrode of the third transistor T3 and a second end of the light emitting element OLED are coupled to the first voltage level end VDD and the second voltage level end VSS respectively. In an embodiment, with reference to FIG. 3a, the first end of the light emitting element OLED is anode, and the second end of the light emitting element OLED is cathode; the first electrode of the third transistor T3 is coupled to the first level end VDD, and the second end of the light emitting element OLED is coupled to the second voltage level end VSS; in another embodiment, with reference to FIG. 3b, the first end of the light emitting element OLED is cathode, and the second end of the light emitting element OLED is anode; the first electrode of the third transistor T3 is coupled to the second level end VSS, and the second end of the light emitting element OLED is coupled to the first voltage level end VDD.

A first electrode of the second transistor T2 is coupled to the first node A, a second electrode of the second transistor T2 is coupled to the second node B, and a control electrode of the second transistor T2 is configured to receive a first control signal $V_{CM}$.

A first electrode of the fourth transistor T4 is coupled to a data line Data. In a specific embodiment, the data line Data is used for providing a data signal or also for providing a reference level $V_{ref}$. In other embodiments, the reference level $V_{ref}$ for the fourth transistor T4 can be also provided in other ways. A control electrode of the fourth transistor T4 is configured to receive a scanning signal $V_{Scan}$. In the present embodiment, the data signal comprises a dark data voltage and a light-emitting data voltage $V_{Data}$, wherein the dark data voltage is a potential that enables the light emitting element OLED not to emit light, and the light-emitting data voltage $V_{Data}$ is a potential that drives the light emitting element OLED to emit light. In FIG. 3a, when the driving transistor T1 is an N-type transistor, the dark data voltage is low voltage level. In FIG. 3b, when the driving transistor T1 is a P-type transistor, the dark data voltage is high level.

The second capacitor C2 is coupled between the control electrode of the driving transistor T1 and the second end of the light emitting element OLED. In the present embodiment, the end of the second capacitor C2 that is coupled to the control electrode of the driving transistor T1 via a direct connection. In other embodiments, indirect connection can be also used. For example, this end of the capacitor C2 is connected to the third node C.

In a specific embodiment, the pixel circuit operates in a first phase, a second phase and a third phase in sequence. In the present embodiment, the first phase can be a dark data writing phase, the second phase can comprise an initialization phase and a threshold compensation phase, and the third phase is a light emitting phase.

Figure 4A:
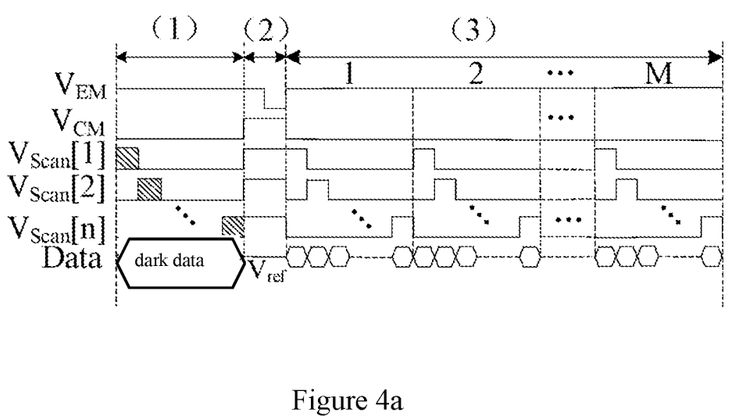
FIG. 4a is an operation timing diagram of a pixel circuit disclosed in an embodiment.
Figure 4B:
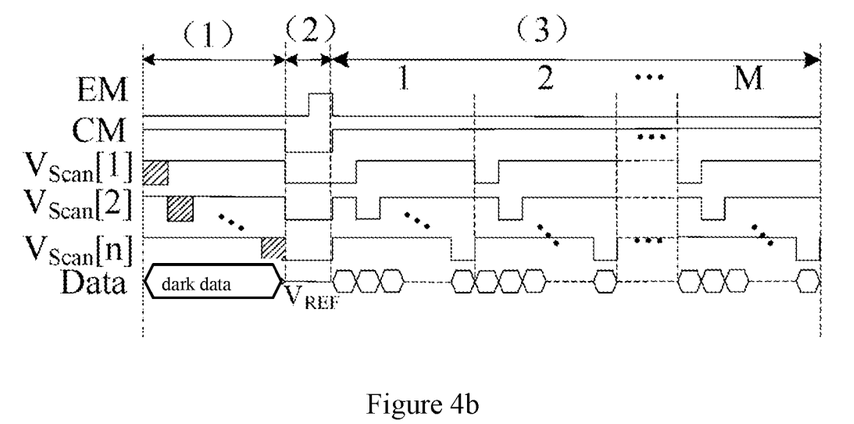
FIG. 4b is an operation timing diagram of a pixel circuit disclosed in another embodiment.

Reference is now made to FIGS. 4a and 4b which are sequence diagrams of the pixel circuits shown in FIGS. 3a and 3b of the present embodiment respectively. In the following, the operation process of the pixel circuit of the present embodiment will be described in connection with FIGS. 3a and 4a. It is noted that when the individual transistors are P-type transistors, for example in the circuit shown in FIG. 3b, the high, low states of individual control signal thereof are reverse to the signal states of the circuit shown in FIG. 3a. Hereinafter, this applies unless specifically indicated otherwise.

During the first phase, i.e., the dark data writing phase as identified by (1) in FIG. 4a, the light emitting control signal $V_{EM}$ is at an effective level (e.g., high level), the scanning signal $V_{Scan}$ is at an effective level (e.g., high level), and the first control signal $V_{CM}$ is at low level. As such, the second transistor T2 is controlled to be at a cut-off state by the first control signal $V_{CM}$, the third transistor T3 is turned on in response to the effective level of the light emitting control signal $V_{EM}$ and is in the turned-on state, and the fourth transistor T4 is turned on in response to the effective level of the scanning signal $V_{Scan}$. At this point, since the dark data voltage is transmitted on the data line Data, the dark data voltage is transmitted to the third node C via the fourth transistor T4 that is turned on, so that the light-emitting element OLED of the pixel circuit is turned off. In a preferred embodiment, when there are a plurality of rows of pixel circuits, the effective levels of the scanning signals $V_{Scan}$ corresponding to each row of the pixel circuits can arrive in sequence ($V_{Scan}$ [1], $V_{Scan}$ [2] . . . $V_{Scan}$[n] as shown in FIG. 4, wherein $V_{Scan}$[n] represents the scanning signal of the $n^{th}$ row of the pixel circuit). Thereby, dark data is written into each row of the pixels in sequence so that the light emitting elements of each row of pixels are turned off in sequence. Until writing of the dark data is finished for the last row of pixels, all the light emitting elements are turned off, and it is ensured that the individual rows of pixel circuits have the same light emitting time.

During the second phase, which may be the initialization phase and the threshold compensation phase illustrated in (2) of FIG. 4a, the initialization phase is followed by the threshold compensation phase.

During the initialization phase, the light emitting control signal $V_{EM}$ is kept at the effective level (e.g., the high level), the first control signal $V_{CM}$ switches to the effective level (e.g., the high level), and the scanning signal $V_{Scan}$, turns to the effective level (e.g., the high level). At this point, the reference level $V_{ref}$ is transmitted on the data line. Therefore, the third transistor T3 is turned on in response to the effective level (e.g., the high level) of the light emitting control signal $V_{EM}$, the fourth transistor T4 is in turned on in response to the effective level (e.g., the high level) of the scanning signal $V_{Scan}$, and the second transistor T2 is turned on in response to the effective level (e.g., the high level) of the first control signal $V_{CM}$. Therefore, the reference level $V_{ref}$ transmitted on the data line is transmitted to the third node C via the fourth transistor T4 that is turned on, so as to initialize the potential of the third node C, i.e., the potential of the third node C is $V_C=V_{ref}$. The first node A and the second node B are coupled with each other via the second transistor T2 that is turned on. Via the third transistor T3 that is turned on, the first level end VDD transmits the potential (e.g., the high level $V_H$) of the first level end VDD to the first node A and the second node B that are coupled with each other, so as to initialize the potentials of the first node A and the second node B. At this point, the potential of the first node A and the potential of the second node B are $V_A=V_B=V_H$. Therefore, the initialization process of the potentials of various nodes is completed. It is noted that in a preferred embodiment, when there are a plurality of rows of pixel circuits, the effective levels of the scanning signals $V_{Scan}$, corresponding to each row of the pixel circuits can arrive simultaneously and the individual pixel circuits complete the initialization process simultaneously. It is noted that in another embodiment as shown in FIG. 3b, the initialized potentials of the first node A and the second node B are provided by the potential (e.g., the low level $V_L$) of the second level end VSS. At this point, the potentials of the first node A and the second node B are $V_A=V_B=V_L$.

During the threshold compensation phase, the first control signal $V_{CM}$ is kept at the effective level (e.g., the high level), the scanning signal $V_{Scan}$, is kept at the effective level (e.g., the high level), and the light emitting control signal $V_{EM}$ turns to the low level. At this point, the reference level $V_{ref}$ is still transmitted on the data line. Therefore, the third transistor T3 is controlled to be at the cut-off state by the light emitting control signal $V_{EM}$, and the fourth transistor T4 keeps at the turned-on state. As such, the potential of the third node C is kept at $V_{ref}$, the first node A and the second node B are coupled with each other via the second transistor T2 that is turned on. At this point, the driving transistor T1 is connected as a diode, and the first node A and the second node B are discharged to the second level end VSS via the driving transistor T1 connected as a diode until the driving transistor T1 is turned off. At this point, the potentials of the first node A and the second node B are $V_A=V_B=V_{OLED}+V_{TH}$, wherein $V_{TH}$ and $V_{OLED}$ are the threshold voltage of the driving transistor T1 and the anode potential of the light emitting element OLED respectively. At this point, $V_{C1}=V_B-V_C=V_{OLED}+V_{TH}-V_{ref}$, wherein $V_{C1}$ is a voltage difference across the first capacitor element C1. Therefore, compensation of the threshold voltages of the driving transistor T1 and the light emitting element OLED is achieved. It is noted that in another embodiment as shown in FIG. 3b, the potentials of the first node A and the second node B are charged by the potential provided by first level end VDD until the driving transistor T1 is turned off so that the process of compensating the threshold voltages of the driving transistor T1 and the light emitting element OLED is completed. It is noted that in a preferred embodiment, when there are a plurality of rows of pixel circuits, the effective levels of the scanning signals $V_{Scan}$, corresponding to each row of the pixel circuits can arrive simultaneously, and the individual pixel circuits complete the threshold compensation process simultaneously.

During the third phase, i.e., the light emitting phase as illustrated in (3) of FIG. 4a, the scanning signal $V_{Scan}$ is kept at the effective level (e.g., the high level), the first control signal $V_{CM}$ turns to the low level, and the light emitting control signal $V_{EM}$ turns to the effective level (e.g., the high level). At this point, the light emitting data voltage $V_{Data}$ is transmitted on the data line. Therefore, the third transistor T3 and the fourth transistor T4 are in a turned-on state, and the light emitting data voltage $V_{Data}$ on the data line is transmitted to the third node C via the fourth transistor T4 that is turned on. As such, the potential of the third node C switches to $V_{Data}$ from $V_{ref}$, and the potential of the second node B becomes $$V_{OLED} + V_{TH} + \frac{C_1 * (V_{data} - V_{ref})}{C_1 + C_2}$$

under the coupling of the first capacitor C1 and the second capacitor C2. The third transistor T3 is turned on in response to the effective level of the light emitting control signal $V_{EM}$, and the driving transistor T1 is turned on in response to the potential of the second node B so as to drive the light emitting element OLED to emit light. At this point, the current flowing through the light emitting element OLED is:

$$\begin{aligned} I_{DS} &= \frac{1}{2}\mu_n C_{ox} \frac{W}{L}(V_{GS} - V_{TH})^2 \\ &= \frac{1}{2}\mu_n C_{ox} \frac{W}{L}\left[V_{OLED} + V_{TH} + \frac{C_1 * (V_{data} - V_{ref})}{C_1 + C_2} - V_{OLED} - V_{TH}\right]^2 \\ &= \frac{1}{2}\mu_n C_{ox} \frac{W}{L}\left[\frac{C_1 * (V_{data} - V_{ref})}{C_1 + C_2}\right]^2 \end{aligned} \quad (1-1)$$

wherein $\mu_n$, $C_{ox}$, W and L are effective mobility, gate capacitance per unit area, channel width and channel length of the driving transistor T1. As can be seen from formula (1-1), the current finally flowing through the light emitting element OLED is irrelevant to the threshold voltage of the driving transistor T1 or the threshold voltage of the OLED. Therefore, the pixel circuit of the present embodiment can well compensate the non-uniformity of displaying.

It is noted that in a preferred embodiment, when there are a plurality of rows of pixel circuits, such as rows "1", "2" . . . "M" as shown in FIGS. 4a and 4b, the effective levels of the scanning signals $V_{Scan}$ corresponding to each row of the pixel circuits can arrive in sequence. Therefore, the fourth transistors T4 of individual pixel circuits may be turned on in sequence, and the light emitting data voltage $V_{Data}$ is written in sequence.

The pixel circuit in the present embodiment can not only compensate the shift of threshold voltage of the driving transistor, but also can compensate the shift of threshold voltage of OLED. In addition, in a preferred embodiment, by using a voltage driving mode based on independent frame compensation, combined with the advantages of the driving mode of progressive scanning and simultaneous compensation and emission of light, the complexity of a peripheral gate driving circuit is reduced and the cost is lowered, also the time of light emitting is greatly increased, and the programming speed of the pixel circuit and panel resolution are improved.

Embodiment II

Figure 5A:
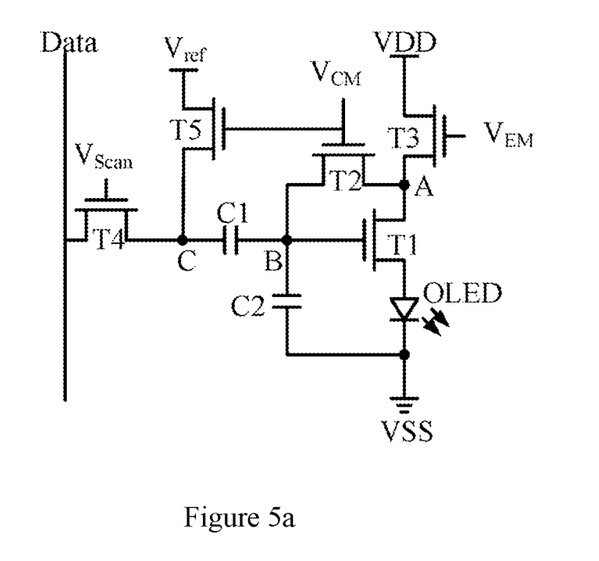
FIG. 5a is a structure diagram of a pixel circuit disclosed in the second embodiment.
Figure 5B:
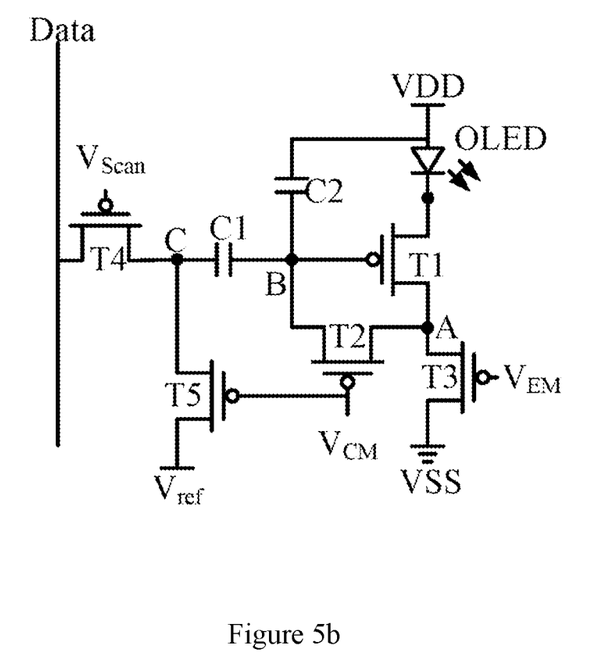
FIG. 5b is a structure diagram of another pixel circuit disclosed in the second embodiment.

Reference is made to FIGS. 5a and 5b, which show a structure diagram of a pixel circuit disclosed in the present embodiment. This embodiment differs from the above embodiment in that pixel circuit disclosed in the present embodiment further comprises a fifth transistor T5. The reference level $V_{ref}$ provided to third node C is transmitted from the fifth transistor T5.

A first electrode of the fifth transistor T5 is configured to receive the reference level $V_{ref}$, a second electrode of the fifth transistor T5 is coupled to the third node C, and a control electrode of the fifth transistor T5 is configured to receive the first control signal $V_{CM}$. With reference to FIG. 5a, in an embodiment, the individual transistors are N-type thin film transistors, the effective levels for turning on the individual transistors are high levels, the dark data voltage is low level, and the initialized potentials of the first node A and the second node B are provided by the first level end VDD. With reference to FIG. 5b, in another embodiment, the individual transistors are P-type thin film transistors, the effective levels for turning on the individual transistors are low levels, the dark data voltage is high level, and the initialized potentials of the first node A and the second node B are provided by the second level end VSS.

Figure 5C:
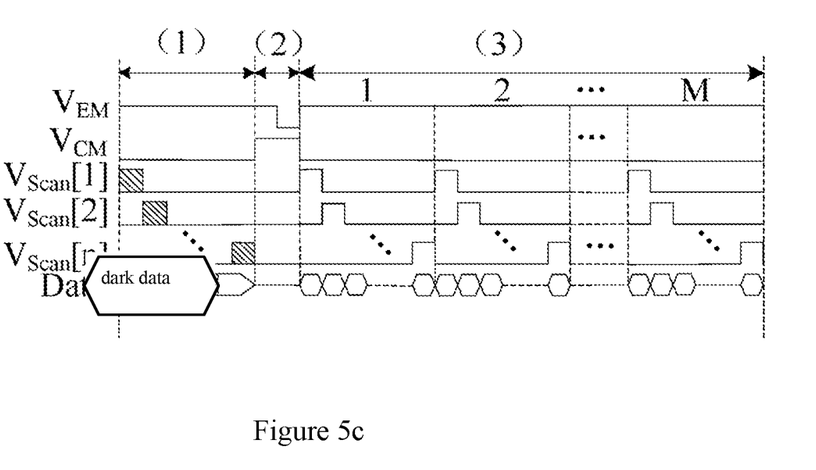
FIG. 5c is an operation timing diagram of a pixel circuit disclosed in the second embodiment.
Figure 5D:
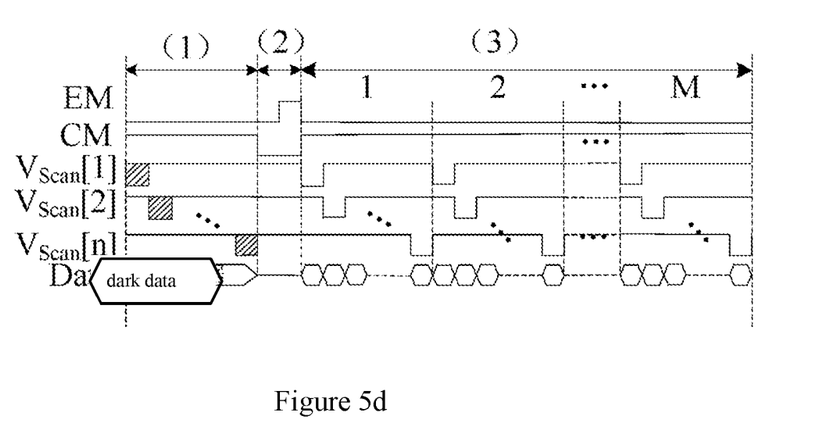
FIG. 5d is an operation timing diagram of another pixel circuit disclosed in the second embodiment.

The driving processes of the pixel circuits of the present embodiment is shown in FIGS. 5c and 5d respectively, wherein FIG. 5c is a sequence diagram of the pixel circuit shown in FIG. 5a, and FIG. 5d is a sequence diagram of the pixel circuit shown in FIG. 5b. The driving processes of the pixel circuits disclosed in the present embodiment are substantially the same as those of the above embodiment with an exception that, in the second phase of the present embodiment, when the first control signal $V_{CM}$ is at the effective level, the fifth transistor T5 is turned on in response to the effective level of the first control signal $V_{CM}$ and transmits the reference level $V_{ref}$ to the third node C so as to initialize the potential of the third node C. Since the reference level $V_{ref}$ is transmitted to the third node C via the fifth transistor T5 and the second electrode of the fourth transistor T4 is also coupled to the third node C, in the second phase, the fourth transistor T4 should be controlled at the cut-off state by the scanning signal $V_{Scan}$ so as to prevent the fourth transistor T4 from transmitting undesired signal interference to the third node C. Correspondingly, in an embodiment, when the fourth transistor T4 is a N-type transistor, the scanning signal $V_{Scan}$ in this phase should be the low level; in another embodiment, when the fourth transistor T4 is a P-type transistor, the scanning signal $V_{Scan}$ in this phase should be the high level. Other phases of the driving processes of the pixel circuits disclosed in the present embodiment are the same as the above embodiment, and a detailed description thereof is omitted herein.

As compared to the embodiment in which the reference level $V_{ref}$ is provided by the data line Data, in the present embodiment, though a data transmission line is required to be configured separately for the fifth transistor T5, the timing control of the data line Data can be simplified, and there is no need to change the signals transmitted by the data line Data frequently, which is more advantageous for timing control of the controller.

Embodiment III

Figure 6A:
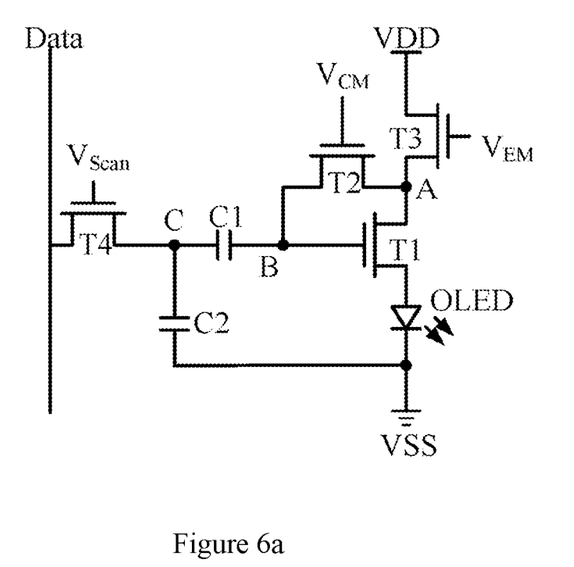
FIG. 6a is a structure diagram of a pixel circuit disclosed in the third embodiment.
Figure 6B:
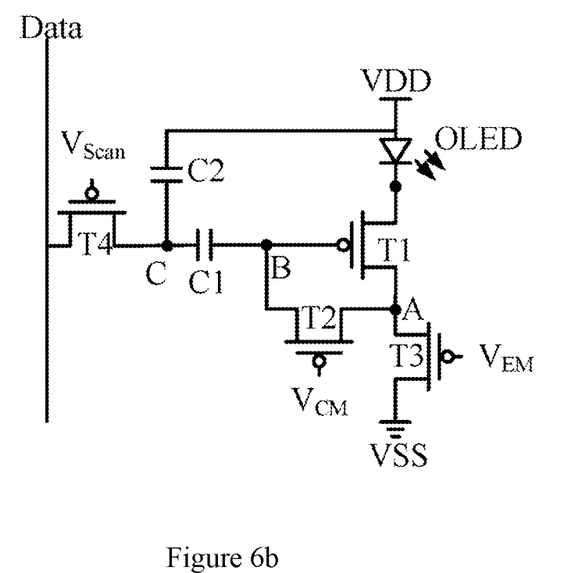
FIG. 6b is a structure diagram of another pixel circuit disclosed in the third embodiment.

Reference is made to FIGS. 6a and 6b, which show a structure diagram of a pixel circuit disclosed in the present embodiment. In the above embodiments, one end of the second capacitor C2 is directly connected to the control electrode of the driving transistor T1, whereas in the present embodiment, the second capacitor C2 is indirectly connected to the control electrode of the driving transistor T1. The end of the second capacitor C2 that is coupled to the control electrode of the driving transistor T1 is coupled to the third node C. Through the coupling of the first capacitor C1, an electrical connection between said end of the second capacitor C2 and the control electrode of the driving transistor T1 is realized. In the pixel circuit disclosed in the present embodiment, other elements are coupled in the same way as the above embodiments, and a detailed description thereof is omitted herein.

In the pixel circuit shown in FIG. 6a, the individual transistors (the driving transistor T1, the second transistor T2, the third transistor T3 and the fourth transistor T4) are N-type thin film transistors; and in the pixel circuit shown in FIG. 6b, the individual transistors (the driving transistor T1, the second transistor T2, the third transistor T3 and the fourth transistor T4) are P-type thin film transistors.

Reference is now made to FIGS. 4a and 4b, which show the operation timing diagrams of the pixel circuits shown in FIGS. 6a and 6b respectively. In the following, the operation process of the pixel circuit of the present embodiment will be described in connection with FIGS. 6a and 4a. It is noted that when the individual transistors are P-type transistors, for example in the circuit shown in FIG. 3b, the high, low states of individual control signal thereof are reverse to that of the signals in the circuit shown in FIG. 6a. Hereinafter, this applies unless specifically indicated otherwise.

During the dark data writing phase, the light emitting control signal $V_{EM}$ is at effective level (e.g., high level), the scanning signal $V_{Scan}$ is at effective level (e.g., high level), and the first control signal $V_{CM}$ is at low level. As such, the second transistor T2 is controlled to be at a cut-off state by the first control signal $V_{CM}$, the third transistor T3 is turned on in response to the effective level of the light emitting control signal $V_{EM}$ and is in the turned-on state, and the fourth transistor T4 is turned on in response to the effective level of the scanning signal $V_{Scan}$. At this point, since the dark data voltage is transmitted on the data line Data, the dark data voltage is transmitted to the third node C via the fourth transistor T4 that is turned on, and is further coupled to the second node B via capacitor so that the light-emitting element OLED of the pixel circuit is turned off. Likewise, in a preferred embodiment, when there are a plurality of rows of pixel circuits, the effective levels of the scanning signals $V_{Scan}$ corresponding to each row of the pixel circuits can arrive in sequence. Thereby, dark data is written into each row of the pixels in sequence so that the light emitting elements of each row of pixels are turned off in sequence. Until writing of the dark data is finished for the last row of pixels, all the light emitting elements are turned off, and it is ensured that the individual rows of pixel circuits have the same light emitting time.

During the initialization phase, the light emitting control signal $V_{EM}$ is kept at the effective level (e.g., the high level), the first control signal $V_{CM}$ switches to the effective level (e.g., the high level), and the scanning signal $V_{Scan}$ is at the effective level (e.g., the high level). At this point, the reference level $V_{ref}$ is transmitted on the data line. Therefore, the third transistor T3 is in the turned-on state in response to the effective level (e.g., the high level) of the light emitting control signal $V_{EM}$, the fourth transistor T4 is in the turned-on state in response to the effective level (e.g., the high level) of the scanning signal $V_{Scan}$, and the second transistor T2 is in the turned-on state in response to the effective level (e.g., the high level) of the first control signal $V_{CM}$; therefore, the reference level $V_{ref}$ transmitted on the data line is transmitted to the third node C via the fourth transistor T4 that is turned on so as to initialize the potential of the third node C, i.e., the potential of the third node C is $V_C = V_{ref}$. The first node A and the second node B are coupled with each other via the second transistor T2 that is turned on, and via the third transistor T3 that is turned on, the first level end VDD transmits the potential (e.g., the high level $V_H$) of the first level end VDD to the first node A and the second node B that are coupled with each other so as to initialize the potentials of the first node A and the second node B. At this point, the potential of the first node A and the potential of the second node B are $V_A = V_B = V_H$; therefore, an initialization process of the potentials of various nodes is completed. It is noted that in a preferred embodiment, when there are a plurality of rows of pixel circuits, the effective levels of the scanning signals $V_{Scan}$, corresponding to each row of the pixel circuits can arrive simultaneously, and the individual pixel circuits complete the initialization process simultaneously. It is noted that in another embodiment as shown in FIG. 6b, the initialized potentials of the first node A and the second node B are provided by the potential (e.g., the low level $V_L$) of the second level end VSS. At this point, the potentials of the first node A and the second node B are $V_A = V_B = V_L$.

During the threshold compensation phase, the first control signal $V_{CM}$ is kept at the effective level (e.g., the high level), the scanning signal $V_{Scan}$, is kept at the effective level (e.g., the high level), and the light emitting control signal $V_{EM}$ turns to the low level. At this point, the reference level $V_{ref}$ is still transmitted on the data line. Therefore, the third transistor T3 is controlled to be at the cut-off state by the light emitting control signal $V_{EM}$, and the fourth transistor T4 keeps at the turned-on state. As such, the potential of the third node C is kept at $V_{ref}$; the first node A and the second node B are coupled with each other via the second transistor T2 that is turned on. At this point, the driving transistor T1 is connected as a diode, and the first node A and the second node B are discharged to the second level end VSS via the driving transistor T1 which is connected as a diode until the driving transistor T1 is cut off. At this point, the potentials of the first node A and the second node B are $V_A = V_B = V_{OLED} + V_{TH}$, wherein $V_{TH}$ and $V_{OLED}$ are the threshold voltage of the driving transistor T1 and the anode potential of the light emitting element OLED respectively. Thereby, the process in which the second node B adjusts the potential according to the threshold voltages of the driving transistor T1 and the light emitting element OLED. At this point, $V_{C1} = V_B - V_C = V_{OLED} + V_{TH} - V_{ref}$, wherein $V_{C1}$ is a voltage difference across the first capacitor element C1. It is noted that in another embodiment as shown in FIG. 6b, the potentials of the first node A and the second node B are charged by the potential provided by first level end VDD until the driving transistor T1 is turned off so that the process of compensating the threshold voltages of the driving transistor T1 and the light emitting element OLED is completed. It is noted that in a preferred embodiment, when there are a plurality of rows of pixel circuits, the effective levels of the scanning signals $V_{Scan}$, corresponding to each row of the pixel circuits can arrive simultaneously, and the individual pixel circuits complete the threshold compensation process simultaneously.

During the light emitting phase, the scanning signal $V_{Scan}$ is kept at the effective level (e.g., the high level), the first control signal $V_{CM}$ switches to the low level, and the light emitting control signal $V_{EM}$ turns to the effective level (e.g., the high level). At this point, the light emitting data voltage $V_{Data}$ is transmitted on the data line. Therefore, the third transistor T3 and the fourth transistor T4 are in the turned-on state, and the light emitting data voltage $V_{Data}$ on the data line is transmitted to the third node C via the fourth transistor T4 that is turned on. As such, the potential of the third node C switches to $V_{Data}$ from $V_{ref}$, and the potential of the second node B becomes $V_{OLED} + V_{TH} + V_{ref} + V_{Data}$ under the coupling of the first capacitor C1, and the driving transistor T1 is turned on in response to the potential of the second node B so as to drive the light emitting element OLED to emit light. At this point, the current flowing through the light emitting element OLED is:

$$\begin{aligned} I_{DS} &= \frac{1}{2}\mu_n C_{ox}\frac{W}{L}(V_{GS} - V_{TH})^2 \\ &= \frac{1}{2}\mu_n C_{ox}\frac{W}{L}(V_{OLED} + V_{TH} - V_{ref} + V_{Data} - V_{OLED} - V_{TH})^2 \\ &= \frac{1}{2}\mu_n C_{ox}\frac{W}{L}(V_{Data} - V_{ref})^2 \end{aligned} \quad (3\text{-}1)$$

wherein $\mu_n$, $C_{ox}$, W and L are effective mobility, gate capacitance per unit area, channel width and channel length of the driving transistor T1. As can be seen from formula (3-1), the current finally flowing through the light emitting element OLED is irrelevant to the threshold voltage of the driving transistor T1 or the threshold voltage of the OLED. Therefore, the pixel circuit of the present embodiment can well compensate the non-uniformity of displaying.

It is noted that in the pixel circuit disclosed in the present embodiment, the fifth transistor T5 is not shown. In an alternative embodiment, the fifth transistor T5 can be also used to transmit the reference level $V_{ref}$. Of course, in the embodiment comprising the fifth transistor T5, when the fifth transistor T5 transmits the reference level $V_{ref}$, the fourth transistor T4 should also be controlled to be at the cut-off state by the scanning signal $V_{Scan}$. For details, please refer to the above embodiment, and a detailed description thereof is not given herein.

According to the pixel circuits disclosed in the above embodiments, the present embodiment also discloses a pixel circuit driving method, wherein each driving cycle of the pixel circuit comprises a dark data writing phase, an initialization and threshold compensation phase and a light emitting phase, the driving method comprising:

during the dark data writing phase, the fourth transistor T4 is turned on in response to the effective level of the scanning signal $V_{Scan}$ and transmits a dark data voltage to the third node C, and controls the light emitting element at a non-emitting state;

during the initialization and threshold compensation phase, the third node C receives the reference level $V_{ref}$ so as to initialize the potential of the third node C; the second node B adjusts the potential according to threshold voltages of the driving transistor T1 and the light emitting element OLED, and stores this potential via the first capacitor C1;

during the light emitting phase, the fourth transistor T4 is turned on in response to the effective level of the scanning signal $V_{Scan}$ and transmits a light emitting data voltage $V_{Data}$ to the third node C, and is coupled to the second node B via capacitor; the third transistor T3 is turned on in response to the effective level of the light emitting control signal $V_{EM}$, and the driving transistor T1 is turned on in response to the potential of the second node B and drives the light emitting element OLED to emit light.

Embodiment IV

Figure 7:
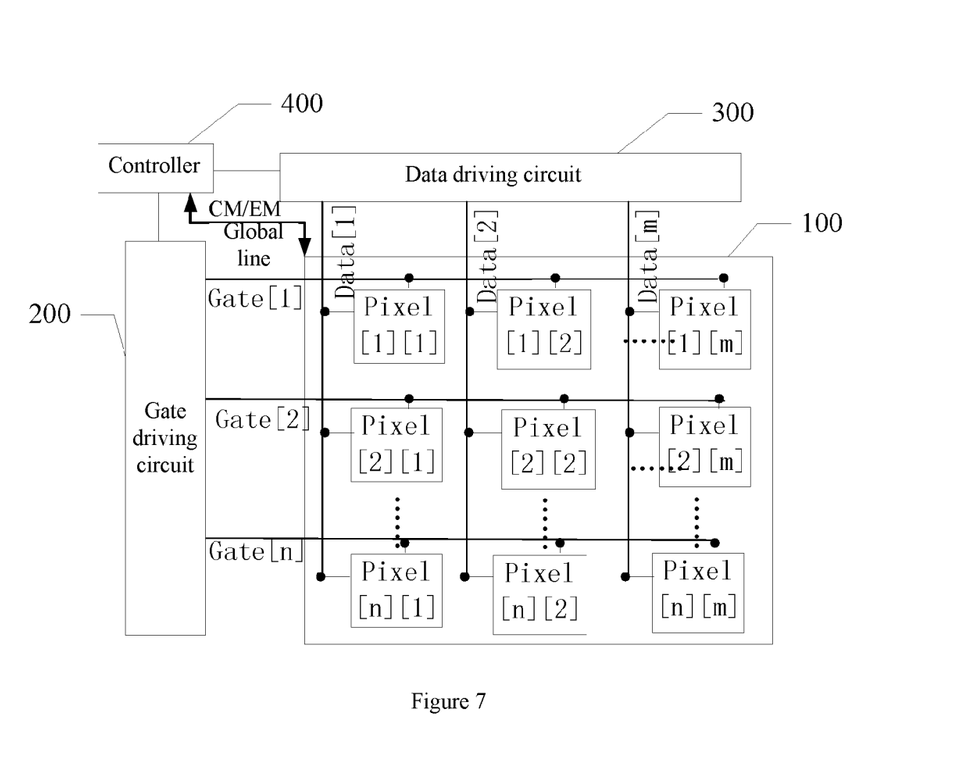
FIG. 7 is a diagram illustrating the principle of a display device disclosed in the fourth embodiment.

The present embodiment also discloses a display device. Reference is made to FIG. 7, which a diagram showing the principle of the display device disclosed in the present embodiment, comprising:

a display panel 100, which comprises: pixel circuits Pixel[1][1] . . . Pixel[n][m] provided by the above embodiments and arranged in a matrix of n rows and m columns, wherein n and m are integers larger than 0, and Pixel[n][m] representing the pixel circuit at the $n^{th}$ row and the $m^{th}$ column; a plurality of scanning lines Gate[1] . . . Gate[n] coupled with each pixel in a first direction (e.g., transverse direction), wherein Gate[n] represents the scanning line corresponding to the $n^{th}$ row of pixel circuit and is configured to provide a scanning control signal (e.g., scanning signal $V_{Scan}$ or the like) to this row of pixel circuit; and a plurality of data lines Data[1] . . . Data[m] in a second direction (e.g., longitudinal direction), wherein Data[m] represents the data line corresponding to the $m^{th}$ column of pixel circuit and is configured to provide data signals for individual pixel circuits, comprising dark data voltage and light emitting data voltage $V_{DATA}$. The display panel can be a liquid crystal display panel, an organic light-emitting display panel, an electronic paper display panel, etc., and correspondingly the display device can be a liquid crystal display, an organic light-emitting display, an electronic paper display, etc.

It is noted that in the present embodiment, the first control signal $V_{CM}$ and the light emitting control signal $V_{EM}$ required for the pixel circuit can be also provided by global lines. For example, the first control line CM may be configured to provide a first control signal $V_{CM}$ simultaneously to individual pixel circuit in the pixel circuit matrix; the light emitting control line EM may be configured to provide a light emitting control signal $V_{EM}$ simultaneously to individual pixel circuit in the pixel circuit matrix. Of course, in another embodiment, for example, the power supply lines required for the first level end and the second level end can be also provided by global lines. Those skilled in the art can make an adjustment as required by the specific pixel circuit;

a gate driving circuit 200, configured to generate a scanning pulse signal and providing a required scanning control signal to the pixel circuit through row scanning lines Gate[1] . . . Gate[n] in the first direction;

a data driving circuit 300, signal output ends of which are coupled to a corresponding data line Data[1] . . . Data[m] on the display panel 100, wherein the data signals generated by the data driving circuit 300 are transmitted to a corresponding pixel unit through data lines Data[1] . . . Data[m] so as to realize gray scale of the image;

a controller 400, which is used for providing a control timing sequence to the gate driving circuit, the data driving circuit, the first control line CM and the light emitting control line EM.

In a preferred embodiment, during the dark data writing phase, individual scanning line provides the effective level of the scanning signal $V_{Scan}$ to individual pixel circuit in sequence line by line, and the individual pixel circuit receives the dark data voltage in sequence line by line; during the initialization and threshold compensation phase, the first control line CM and the light emitting control line EM provide a corresponding level of the first control signal $V_{CM}$ and a corresponding level of the light emitting control signal $V_{EM}$ to individual pixel circuit simultaneously; the individual pixel circuit, in response to the effective level of the scanning signal $V_{Scan}$ provided by its row of scanning line, simultaneously extracts the threshold voltages of their respective driving transistor T1 and light emitting element (OLED); during the light emitting phase, the first control line CM controls respective transistors (e.g., the second transistor T2, or the second transistor T2 and the fourth transistor T4) to be at the cut-off state, and the light emitting control line EM provides the effective level of the light emitting control signal $V_{EM}$ to individual pixel circuits simultaneously; individual scanning line provides the effective level of the scanning signal $V_{Scan}$ to individual pixel circuit line by line, the individual pixel circuit receives the light emitting data voltage $V_{Data}$ in sequence line by line, and the individual pixel circuit emits light in sequence line by line.

The application has been described above with reference to specific examples which are intended merely to help understand the application rather than limiting the application. Those skilled in the art can also make various simple deductions, variations or replacements according to the spirit of the application.

What is claimed is:

1. A pixel circuit, comprising:
   a first transistor and a light emitting element coupled in series between a first voltage level end and a second voltage level end; a second transistor; a third transistor; a fourth transistor; a first capacitor; and a second capacitor,
   wherein a first electrode of the first transistor is coupled to a second electrode of the third transistor to form a first node; a second electrode of the first transistor is coupled to a first end of the light emitting element; a control electrode of the first transistor is coupled to one end of the first capacitor to form a second node; and another end of the first capacitor is coupled to a second electrode of the fourth transistor to form a third node,
   a control electrode of the third transistor is configured to receive a light emitting control signal,
   a first electrode of the third transistor and a second end of the light emitting element are coupled to the first voltage level end and the second voltage level end respectively,
   a first electrode of the second transistor is coupled to the first node, a second electrode of the second transistor is coupled to the second node, and a control electrode of the second transistor is configured to receive a first control signal,
   a first electrode of the fourth transistor is coupled to a data line, configured to receive a data signal or a reference voltage level; a control electrode of the fourth transistor is configured to receive a scanning signal, and
   the second capacitor is coupled between the control electrode of the first transistor and the second end of the light emitting element.

2. The pixel circuit according to claim 1, wherein the data signal comprises a dark data voltage and a light-emitting data voltage; the dark data voltage is a voltage that enables the light emitting element not to emit light, and the light-emitting data voltage is a potential that drives the light emitting element to emit light,
- in a first phase, the fourth transistor is turned on in response to an effective level of the scanning signal to transmit the dark data voltage to the third node,
- in a second phase, the second transistor couples the first node with the second node in response to an effective level of the first control signal, the third transistor is turned on in response to an effective level of the light emitting control signal, and transmits voltage of the first voltage level end or the second voltage level end to the first node and the second node so as to initialize the first node and the second node; the third node receives the reference voltage level so as to initialize the potential of the third node; after the initialization is completed for the nodes, the light emitting control signal controls the third transistor to be at a cut-off state, and according to threshold voltages of the first transistor and the light emitting element, the first node and the second node adjust potentials via the first transistor that is turned on, and store the potentials in the first capacitor, and
- during a third phase, the second transistor is controlled to be at a cut-off state by the first control signal; the third transistor is turned on in response to the effective level of the light emitting control signal; the fourth transistor is turned on in response to the effective level of the scanning signal to transmit the light-emitting data voltage to the third node; the light-emitting data voltage is coupled to the second node via the capacitor, and the first transistor is turned on in response to potential of the second node so as to drive the light emitting element to emit light.

3. The pixel circuit according to claim 2, wherein:
the reference voltage level is provided by data lines; during the second phase, the fourth transistor is turned on in response to the effective level of the scanning signal to transmit the reference voltage level to the third node so as to initialize the potential of the third node.

4. The pixel circuit according to claim 2, wherein:
the first transistor, the light emitting element, the second transistor, the third transistor and the fourth transistor are N-type transistors, and the effective levels for turning on individual transistors are high levels;
the dark data voltage is low level; and
the first electrode of the third transistor is coupled to the first voltage level end, and the second end of the light emitting element is coupled to the second voltage level end.

5. The pixel circuit according to claim 4, further comprises a fifth transistor;
a first electrode of the fifth transistor is configured to receive the reference level, a second electrode of the fifth transistor is coupled to the third node, and a control electrode of the fifth transistor is configured to receive the first control signal; and
during the second phase, the fifth transistor is turned on in response to the effective level of the first control signal to transmit the reference level to the third node so as to initialize the potential of the third node.

6. The pixel circuit according to claim 2, wherein:
the first transistor, the light emitting element, the second transistor, the third transistor and the fourth transistor are P-type transistors, and the effective levels for turning on individual transistors are low levels;
the dark data voltage is high level; and
the first electrode of the third transistor is coupled to the second voltage level end, and the second end of the light emitting element is coupled to the first voltage level end.

7. The pixel circuit according to claim 6, further comprises a fifth transistor;
a first electrode of the fifth transistor is configured to receive the reference level, a second electrode of the fifth transistor is coupled to the third node, and a control electrode of the fifth transistor is configured to receive the first control signal; and
during the second phase, the fifth transistor is turned on in response to the effective level of the first control signal to transmit the reference level to the third node so as to initialize the potential of the third node.

8. A display device, characterized by comprising:
a pixel circuit matrix, including the pixel circuits according to claim 2 arranged including n rows and m columns, wherein n and m are integers larger than zero;
a gate driving circuit, configured to generate a scanning pulse signal and provide a required scanning signal to the pixel circuits through the scanning lines formed in a first direction;
a data driving circuit, configured to generate a data voltage signal representing gray scale information, and provide the data signal to the pixel circuits through the data lines formed in a second direction;
a first control line, configured to provide a first control signal to the pixel circuits in the pixel circuit matrix simultaneously;
a light emitting control line, configured to provide a light emitting control signal to the pixel circuits in the pixel circuit matrix simultaneously; and
a controller, configured to provide a control timing to the gate driving circuit, the data driving circuit, the first control line and the light emitting control line.

9. The display device according to claim 8, wherein, one driving cycle of the display device comprises a dark data writing phase, an initialization and threshold compensation phase and a light emitting phase;
during the dark data writing phase, the scanning lines provide the effective level of the scanning signal to the pixel circuits in sequence line by line, and the pixel circuits receive the dark data voltage in sequence line by line;
during the initialization and threshold compensation phase, the first control line and the light emitting control line provide a corresponding level of the first control signal and a corresponding level of the light emitting control signal to the pixel circuits simultaneously; the pixel circuits, in response to the effective level of the scanning signal provided by its row of scanning line, simultaneously extract the threshold voltages of their respective driving transistor and light emitting element; and
during the light emitting phase, the first control line controls corresponding transistors to be at cut-off state, and the light emitting control line provides the effective level of the light emitting control signal to the pixel circuits simultaneously; the scanning lines provide the effective level of the scanning signal to the pixel circuits line by line, the pixel circuits receive the light emitting data voltage in sequence line by line, and the pixel circuit emit light in sequence line by line.

* * * * *